(12) United States Patent
Kang et al.

(10) Patent No.: US 7,288,832 B2
(45) Date of Patent: Oct. 30, 2007

(54) CHIP-MOUNTED FILM PACKAGE

(75) Inventors: Sin Ho Kang, Gyeonggi-do (KR); Seung Kuk Aiin, Gyeongsangbuk-do (KR)

(73) Assignee: L.G. Philips LCD Co., Ltd., Seoul (KR)

( * ) Notice: Subject to any disclaimer, the term of this patent is extended or adjusted under 35 U.S.C. 154(b) by 280 days.

(21) Appl. No.: 11/016,892

(22) Filed: Dec. 21, 2004

(65) Prior Publication Data
US 2005/0139963 A1    Jun. 30, 2005

(30) Foreign Application Priority Data
Dec. 30, 2003    (KR) .................... 10-2003-0099803

(51) Int. Cl.
*H01L 23/495*    (2006.01)

(52) U.S. Cl. .......... 257/668; 257/E23.05; 257/E23.06; 257/E23.07

(58) Field of Classification Search ............... 257/618, 257/730, 777, 786, E23.003, E23.004, E21.516
See application file for complete search history.

(56) References Cited

U.S. PATENT DOCUMENTS

| | | | | |
|---|---|---|---|---|
| 5,402,255 A | * | 3/1995 | Nakanishi et al. | 349/150 |
| 5,768,105 A | * | 6/1998 | Aota et al. | 361/777 |
| 6,313,526 B1 | * | 11/2001 | Nakamura | 257/706 |
| 6,388,888 B1 | * | 5/2002 | Seko et al. | 361/767 |
| 6,495,768 B1 | * | 12/2002 | Cho | 174/250 |
| 6,992,372 B2 | * | 1/2006 | Sumi | 257/668 |
| 2001/0024259 A1 | * | 9/2001 | Song et al. | 349/149 |

* cited by examiner

*Primary Examiner*—Anh D. Mai
*Assistant Examiner*—Christopher M Roland
(74) *Attorney, Agent, or Firm*—Morgan, Lewis & Bockius LLP

(57) ABSTRACT

A chip-mounted film package includes a base film, an effective film package defined on the base film by a cutting line, a driving chip mounted on the effective film package, a plurality of input pads arranged on an input area of the effective film package and connected to the driving chip, and a plurality of output pads arranged on an output area of the effective film package and connected to the driving chip, wherein the output area includes at least one extended portion that protrudes from a side of the effective film package in a horizontal direction of the base film.

5 Claims, 6 Drawing Sheets

CHIP-MOUNTED FILM PACKAGE

This application claims the benefit of Korean Patent Application No. P2003-99803 filed in Korea on Dec. 30, 2003, which is hereby incorporated by reference.

BACKGROUND OF THE INVENTION

1. Field of the Invention

The present invention relates to a liquid crystal display module, and more particularly to a chip-mounted film package of the liquid crystal display module.

2. Discussion of the Related Art

Generally, a liquid crystal display (LCD) employs an electric field to control light transmittance through a liquid crystal having a dielectric anisotropy, thereby displaying a picture. Specifically, the LCD includes an LCD panel for displaying a picture, and a driving circuit for driving the LCD panel. In the LCD panel, liquid crystal cells are arranged in a matrix to control light transmittance in accordance with pixel signals, thereby displaying a picture. The driving circuit includes a gate driver for driving gate lines of the LCD panel, a data driver for driving the data lines, a timing controller for controlling a driving timing of the gate driver and the data driver, and a power supply for supplying power signals required for driving the LCD panel and the driving circuit.

The data driver and the gate driver are separated into a plurality of drive integrated circuits (D-ICs). Each of the D-ICs is mounted on an opened IC area of a tape carrier package (TCP) or on a base film of the TCP by a chip on film (COF) system, to thereby be electrically connected to the LCD panel by a tape automated bonding (TAB) system. Alternatively, the D-IC may be directly mounted on the LCD panel by a chip on glass (COG) system. Since the TAB system ensures that a relatively wide pixel matrix area from the LCD panel has an easy attachment process, it has been mainly used.

FIG. 1 is a plan view schematically illustrating a rear structure of a related art LCD module. As shown in FIG. 1, the related art LCD module includes a data TCP (or COF) 12 and a gate TCP (or COF) 16. The data TCP 12 (or COF) is connected between a data PCB 20 and an LCD panel 10 and has a data D-IC 14 mounted thereon. On the other hand, the gate TCP (or COF) 16 is connected between a gate PCB 22 and the LCD panel 10 and has a gate C-IC 18 mounted thereon.

The LCD panel 10 has a thin film transistor array substrate and a color filter array substrate that are bonded to each other with a liquid crystal layer therebetween. The LCD panel 10 includes liquid crystal cells between gate lines and data lines. Each of the liquid crystal cells includes a thin film transistor as a switching device. The thin film transistor applies a pixel signal from the data line in response to a scanning signal from the gate line.

The data D-IC 14 is connected to the data line of the LCD panel 10 via the data TCP (or COF) 12. The data D-IC 14 converts a digital pixel data signal from an external timing controller (not shown) into an analog pixel signal and applies the analog pixel signal to the data line. On the other hand, the gate D-IC 18 is connected to the gate line of the LCD panel 10 via the gate TCP (or COF) 16. The gate D-IC 10 supplies a turn-on voltage of the thin film transistor to the gate line during a corresponding scan period while supplying a turn-off voltage of the thin film transistor to the gate line during the remaining period.

The data TCP (or COF) 12 and the gate TCP(or COF) 16 shown in FIG. 1 are prepared on a roll-type base TCP and then are molded by a cutting process. FIG. 2 is a plan view showing the data TCP (or COF) 12 before the cutting process of the related art LCD module. As shown in FIG. 2, the data TCP (or COF) 12 is provided on a base film 32 of the roll-type base TCP 30. The base film 32 is usually made of polyimide. The data TCP (or COF) 12 has the data D-IC 14 mounted thereon, and is also provided with a plurality of input pads IP connected to input pins of the data D-IC 14 and a plurality of output pads OP connected to output pins thereof. Further, a sprocket hole 34 is provided in a line along the vertical direction at each side of the base film 32 so as to deliver the base film 32 and determine a delivery position.

The data TCP (or COF) 12 is molded by a process of cutting the base TCP 30 along a cutting line CL. The molded data TCP (or COF) 12 is attached to the LCD panel 10 shown in FIG. 1 and to the data PCB 20 by an anisotropic conductive film ACF. A first aligning mark 15 adjacent to the input pad IP is provided within the data TCP (or COF) 12 so as to make an alignment of the data TCP (or COF) 12 with the data PCB 20. A second aligning mark 17 adjacent to the output pad OP is provided within the data TCP (or COF) 12 so as to make an alignment of the data TCP (or COF) 12 with the LCD panel 10.

The data TCP (or COF) 12 is provided on the base TCP 32 generally having a normal horizontal width of 35 mm as shown in FIG. 2 such that the data TCP (or COF) 12 has 384 output pads OP, namely, 384 output channels in light of manufacturing costs. In this case, the data TCP (or COF) 12 has an effective horizontal width of about 27 mm excluding a dummy area where the sprocket hole 34 are formed on the base TCP 30. Moreover, the 384 output pads OP of the data TCP(or COF) 12 are provided in parallel to each other at a pitch P1 of about 60 μm in light of reliability and process tolerance. The 384 output channels of the data TCP (or COF) 12 correspond to output channels of the data D-IC 14.

In order to reduce manufacturing costs by reducing the number of the data TCP (or COF) 12 and the data D-IC 14 that are expensive, the number of the output channels of the data TCP (or COF) 12 and the data D-IC 14 should be increased. For instance, when the LCD panel 10 has a XGA class resolution of 1024×768 pixels, it is provided with total 3072 data lines in light of R, G and B sub-pixel included per pixel. If the 3072 data lines are intended to be driven by the data D-IC 14 having the 384 output channels shown in FIG. 2, then the LCD panel 10 of FIG. 1 must include 8 (i.e., 3072/384=8) data D-ICs 14 and 8 data TCPs (or COFs) 12 mounted with them. However, the data D-IC 14 includes a digital to analog converter (DAC) having a complex structure proportional to the number of data lines in order to convert 6-bit or 8-bit pixel data supplied per data line into analog pixel signals. Thus, once the number of the output channels of the data D-ICs 14 is increased, the circuit structure becomes complex and difficult to enlarge a chip area as well as an area of the data TCP (or COF) 12 mounted with the data D-IC 14. Moreover, the TCP (or COF) has a relatively high cost with respect to an area thereof. Thus, there is a problem in that, once the number of the output channels of the data D-IC 14 is increased, an area of the TCP (or COF) is enlarged, which makes the manufacturing costs rise more.

In order to overcome this problem, a proposal has been made to reduce an area occupied by the DAC circuit by using a time-divisional driving of the data lines so as to increase the number of output channels of the data D-ICs while controlling the chip area, thereby reducing the number of the D-ICs and TCPs, as disclosed in Korea Patent Application No. 2002-41769. However, since the number of the output channels of the data D-ICs are increased by twice when the number of the data D-ICs is reduced to a half (½) and hence an area occupied by the output pads instead of the D-ICs is enlarged, it becomes necessary to provide a base TCP having a larger dimension than the existent 35 mm base TCP. Moreover if a 70 mm TCP instead of the 35 mm TCP is used for the purpose of increasing the number of the output channels per TCP by twice, then there is a problem in that an expensive TCP also leads to an increase of the manufacturing costs.

In order to solve this problem, a strategy has been proposed to reduce a distance between the output channels within the TCP (or COF) to increase the number of output channel per unit area. However, this strategy has a limitation in that reducing a distance between the output pads can only be done to certain degree in light of reliability and manufacturing process tolerances. Moreover, an effective area to be occupied by the data TCP (or COF) 12 is further reduced even on the 35 mm base TCP 30 as shown in FIG. 2 due to the dummy area for forming the sprocket holes 34 to thereby have a horizontal width of about 27 mm. As a result, the data TCP (or COF) 12 having an effective horizontal width of 27 mm as shown in FIG. 2 is limited to an increase of 384 output pads OP provided at a pitch P1 of about 60 μm, that is, the number of the output channels.

Therefore, there is a desire to enlarge an effective area of the data TCP (or COF) 12 without enlarging the base TCP (or COF), which adversely affects the manufacturing costs, thereby increasing the number of the output channels.

SUMMARY OF THE INVENTION

Accordingly, the present invention is directed to a chip-mounted film package that substantially obviates one or more of the problems due to limitations an disadvantages of the related art.

An object of the present invention is to provide a chip-mounted film package having an enlarged effective area within a base TCP (or COF).

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the chip-mounted film package includes a base film including a cutting line, an effective film package defined on the base film by the cutting line and including input area and output area, a driving chip mounted on the effective film package, a plurality of input pads arranged on the input area of the effective film package and connected to the driving chip, and a plurality of output pads arranged on the output area of the effective film package and connected to the driving chip, wherein the output area includes at least one extended portion that protrudes from a side of the effective film package in a horizontal direction of the base film.

In another aspect, the chip-mounted film package includes a base film including a dummy area and a cutting line, the dummy area being outside of the cutting line, an effective film package defined on the base film by the cutting line, the effective film package having input pads and output pads, a driving chip mounted on the effective film package and connected to the input and output pads of the effective film package, a plurality of sprocket holes arranged in the dummy area in a horizontal direction of the base film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 3:
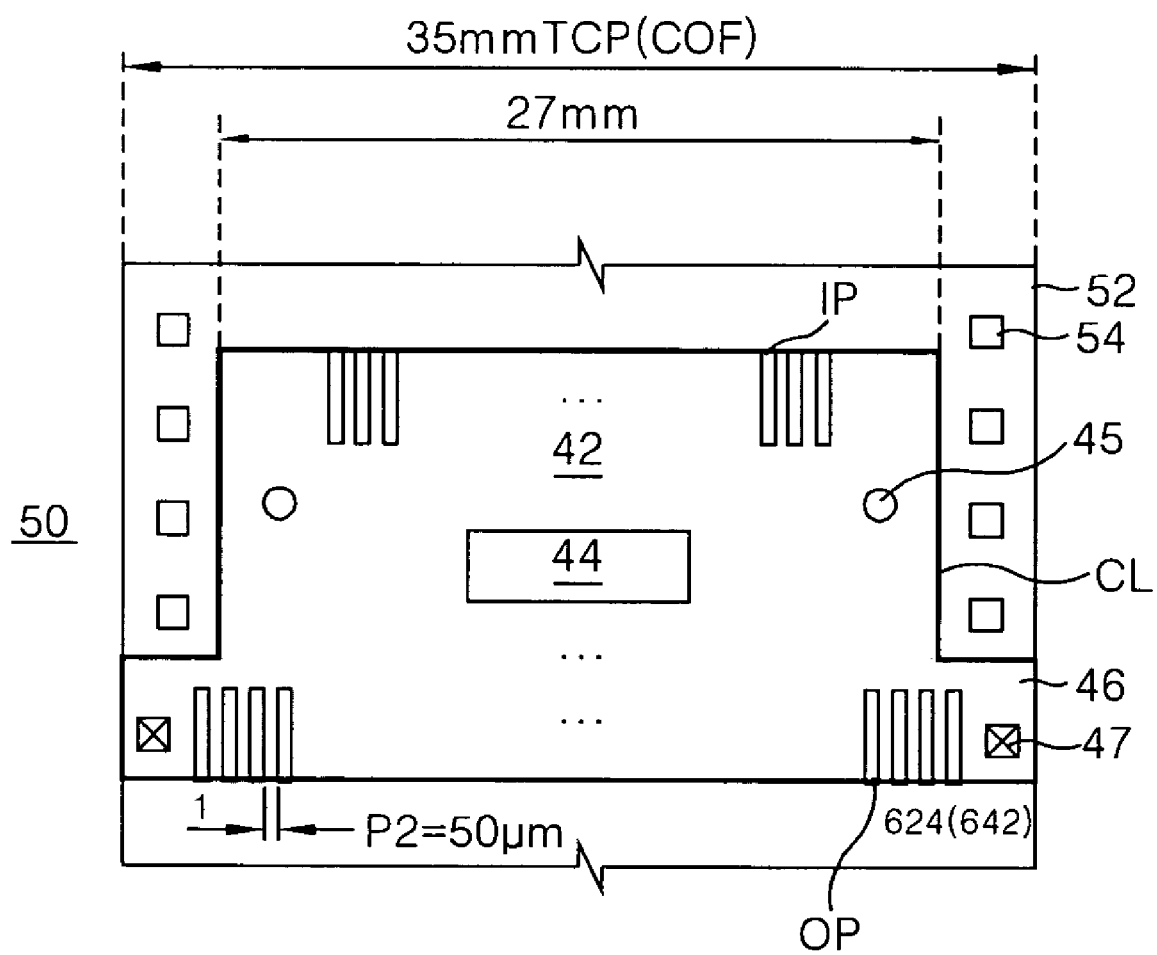
FIG. 3 is a plan view showing a structure of a TCP (or COF) according to a first embodiment of the present invention.

FIG. 3 is a plan view showing a roll-type base TCP (or COF) 50 provided with an effective TCP (or COF) 42 according to a first embodiment of the present invention. Herein, the effective TCP (or COF) 42 corresponds to a data TCP mounted with a data D-IC or a gate TCP mounted with a gate D-IC.

As shown in FIG. 3, the effective TCP (or COF) 42 is provided on a base film 52 of the roll-type base TCP (or COF) 50. The base film 52 is usually made of polyimide. An area of the effective TCP (or COF) 42 at the base TCP (or COF) 50 is determined by a cutting line CL. The effective TCP (or COF) 42 is molded by a process of cutting the base TCP (or COF) 50 along the cutting line CL. The base film 52 is delivered into a dummy area positioned at the outer side of the effective TCP (or COF) 42, namely, the cutting line CL. A sprocket hole 54 for determining the delivery position is provided along a line on the dummy area as shown in FIG. 3.

The effective TCP (or COF) 42 is mounted with a data D-IC 44, and is provided with a plurality of input pads IP connected to input pins of the data D-IC 44 and a plurality of output pads OP connected to output pins thereof Further, the effective TCP (or COF) 42 includes an extended portion 46 that protrudes from sides of the effective TCP (or COF) 42 in a horizontal direction so as to enlarge an effective area of the effective TCP (or COF) 42 at which the output pads OP are able to be formed on the 35 mm base TCP (or COF) 50. In this exemplary embodiment, a distance between the sprocket holes 54 is increased such that the extended portion 46 does not interfere with the sprocket holes 54, thereby positioning the extended portion 46 between the sprocket holes 54. Or at least one of sprocket holes 54 is removed so as to leave a space for forming the extended portion 46. Thus, the extended portion 46 is extended into the edge of the base TCP (or COF) 50, thereby allowing the output pads OP of the effective TCP (or COF) 42 to be formed on an enlarged effective area with a horizontal width (i.e., 35 mm) of the base TCP (or COF) 50. Thus, it becomes possible to enlarge the effective area for forming the output pads OP of the effective TCP (or COF) 42 without enlarging the horizontal width of the base TCP (or COF) 50. As a result, it is possible to increase the number of output pads OP that are formed within the effective TCP (or COF) 42.

The data TCP (or COF) 42 molded along the cutting line CL is attached between a data PCB 60 (of FIG. 6) and an LCD panel 40 (of FIG. 6) by using an anisotropic conductive film ACF. In this exemplary embodiment, a first aligning mark 45 adjacent to the input pad IP is provided within the data TCP (or COF) 42 so as to make an alignment of the data TCP (or COF) 42 with the data PCB 60. A second aligning mark 47 adjacent to the output pad OP is provided within the data TCP (or COF) 42 so as to make an alignment of the data TCP (or COF) 42 with the LCD panel 40.

Figure 4:
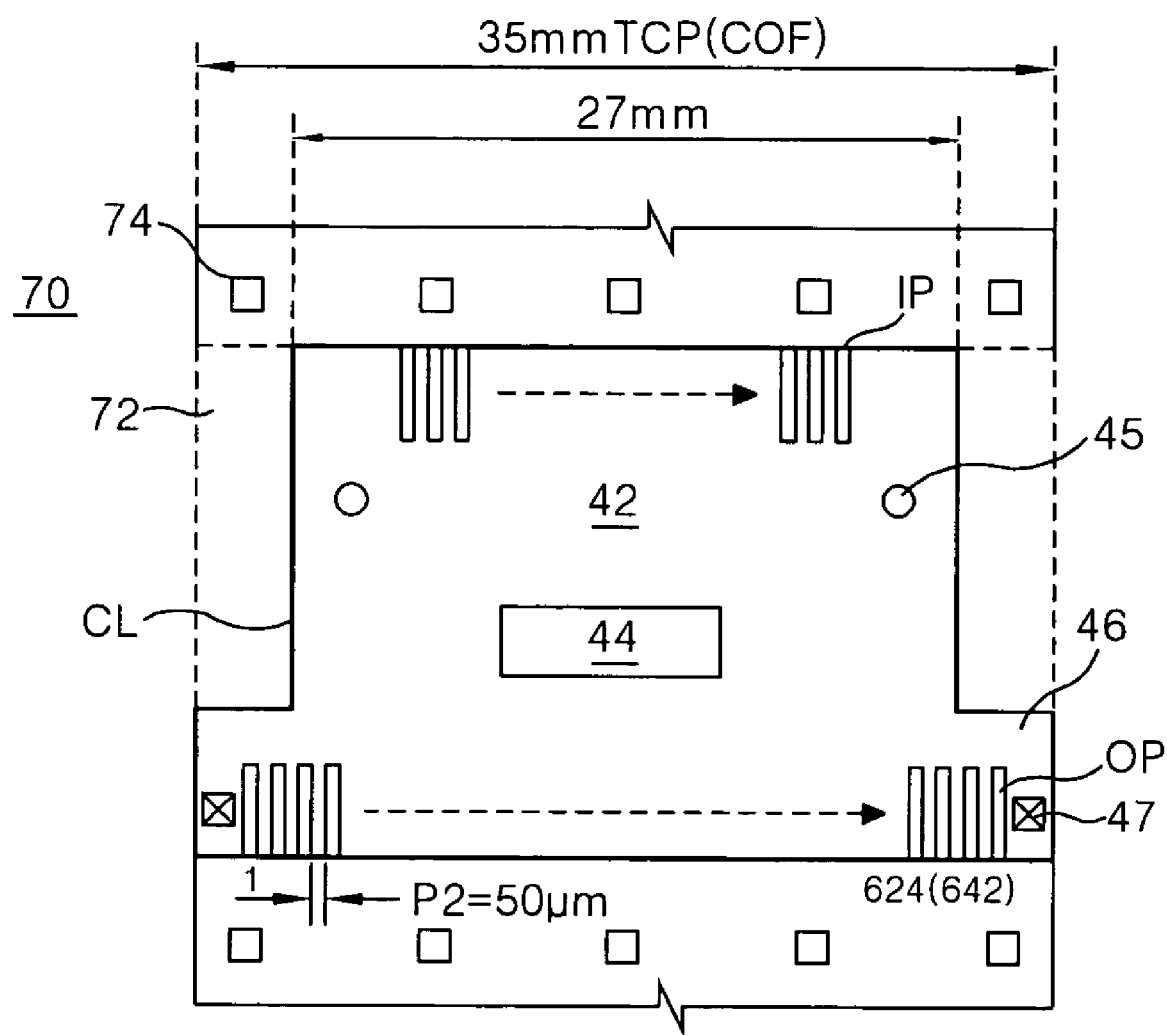
FIG. 4 is a plan view showing a structure of a TCP (or COF) according to a second embodiment of the present invention.

FIG. 4 is a plan view showing of a base TCP (or COF) provided with an effective TCP (or COF) according to a second exemplary embodiment. As shown in FIG. 4, sprocket holes 74 of a base film 72 are provided along a line in the horizontal direction in a dummy area positioned at an outer side of the effective TCP (or COF) 42 defined by the cutting line CL. In other words, the sprocket holes 74 are provided in the horizontal direction in the dummy area between the effective TCPs (or COFs) 42. Thus, the effective TCP (or COF) 42 has a horizontal width equal to the horizontal width (i.e., 35 mm) of the base TCP (or COF) 50. The output pads OP are also arranged on the extended portion 46 that protrudes from the sides of the effective TCP (or COF) 42.

Figure 5:
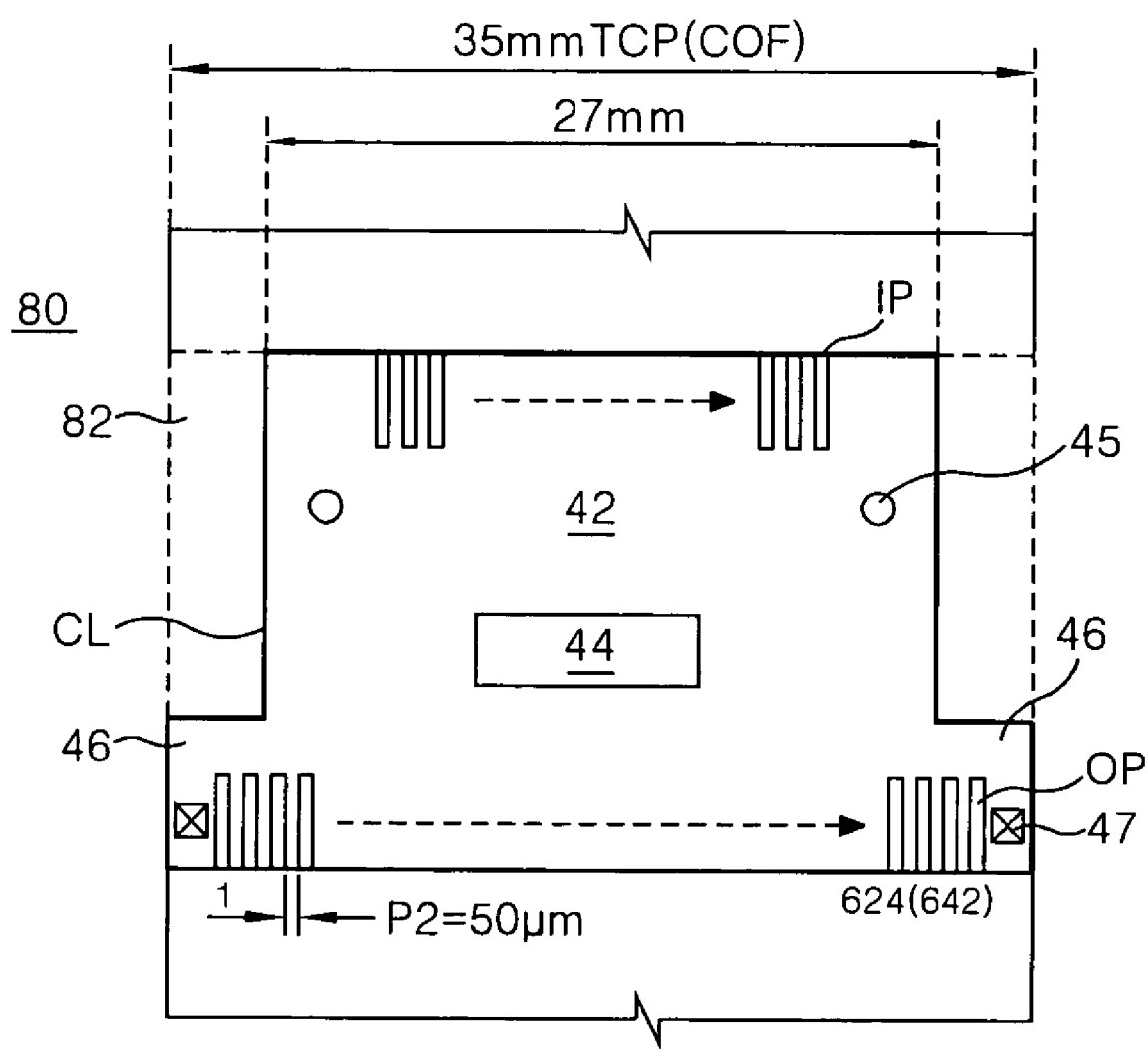
FIG. 5 is a plan view showing a structure of a TCP (or COF) according to a third embodiment of the present invention.

FIG. 5 is a plan view showing of a base TCP (or COF) provided with an effective TCP (or COF) according to a third exemplary embodiment. As shown in FIG. 5, even when no sprocket hole is provided in a dummy area of a base film 82, the effective TCP (or COF) 42 has a horizontal width equal to the horizontal width (i.e., 35 mm) of a base TCP (or COF) 80. In this exemplary embodiment, the base film 82 may be delivered by a rolling system.

In both the second and third exemplary embodiments, the effective TCP (or COF) 42 includes the extended portion 46 extended into the edges of the base TCP (or COF) 70/80 in the horizontal direction as shown in FIGS. 4 and 5, thereby enlarging an effective area for forming the output pads OP of the effective TCP (or COF) 42 on the base TCP (or COF) 70/80. Thus, the horizontal width (i.e., 35 mm) of the base TCP (or COF) 70/80 becomes an effective horizontal width of an area for forming the output pads OP of the effective TCP (or COF) 42. Also, an area on which the input pads IP are to be arranged extend into the edges of the base TCP (or COF) 70/80 like the dotted line, so that the base TCP (or COF) 70/80 has the 35 mm effective horizontal width for the formation of the input pads IP.

Figure 1:
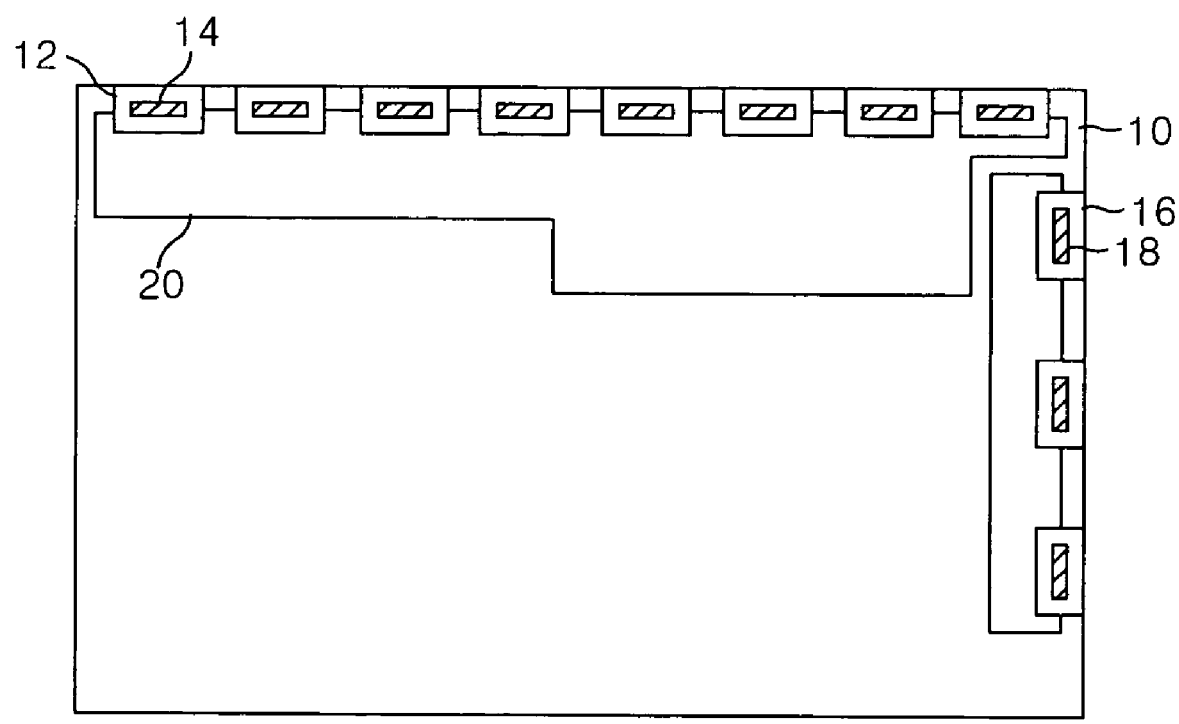
FIG. 1 is a plan view schematically illustrating a rear structure of a related art LCD module.
Figure 2:
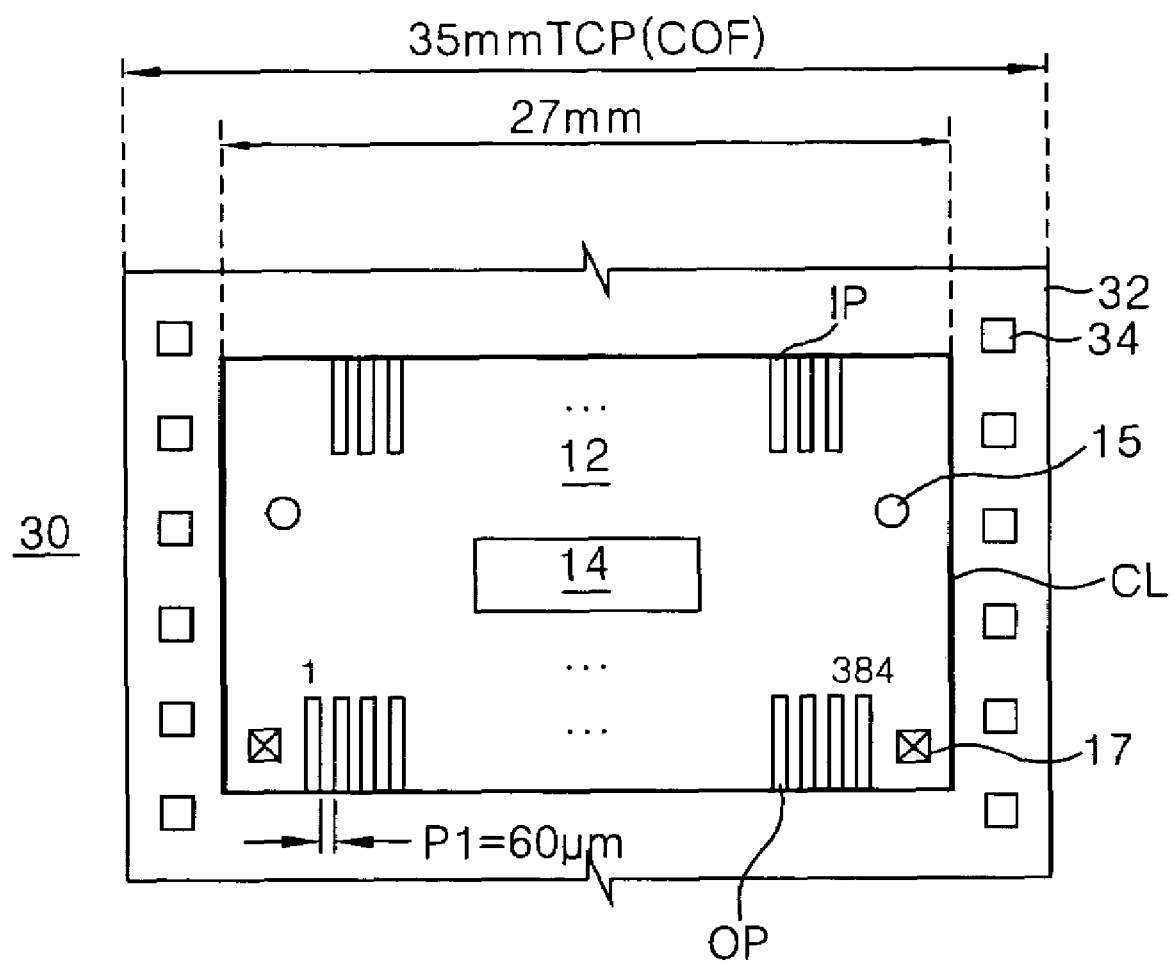
FIG. 2 is a plan view showing a data TCP (or COF) before a cutting process of the data TPC (or COF) of the related art LCD module.

Accordingly, the effective area for forming the output pads OP of the effective TCP (or COF) 42 can be enlarged without enlarging the base TCP (or COF) 70/80. As a result of the above-described arrangement, the number of the output channels is increased. Moreover, an output pad area having an effective horizontal width of 35 mm may be provided with 624 to 642 output pads OP having a spaced distance of about at least 50 μm on the effective TCP (or COF) 42. Herein, these output pads OP are made by a fine pitch forming process and an assembly process. Thus, since the number of the output channels is increased on the existent 35 mm base TCP (COF) 50/70/80, the number of the effective TCPs (or COFs) 42 of FIG. 6 is fewer than the number of the effective TCPs (or COFs) 12 of FIG. 1.

Next, a description of applying the effective TCP (or COF) 42 according to any one of the above-described exemplary embodiments to the data TCP (or COF) 42 of the LCD panel 40 will be given with reference to FIG. 6.

Figure 6:
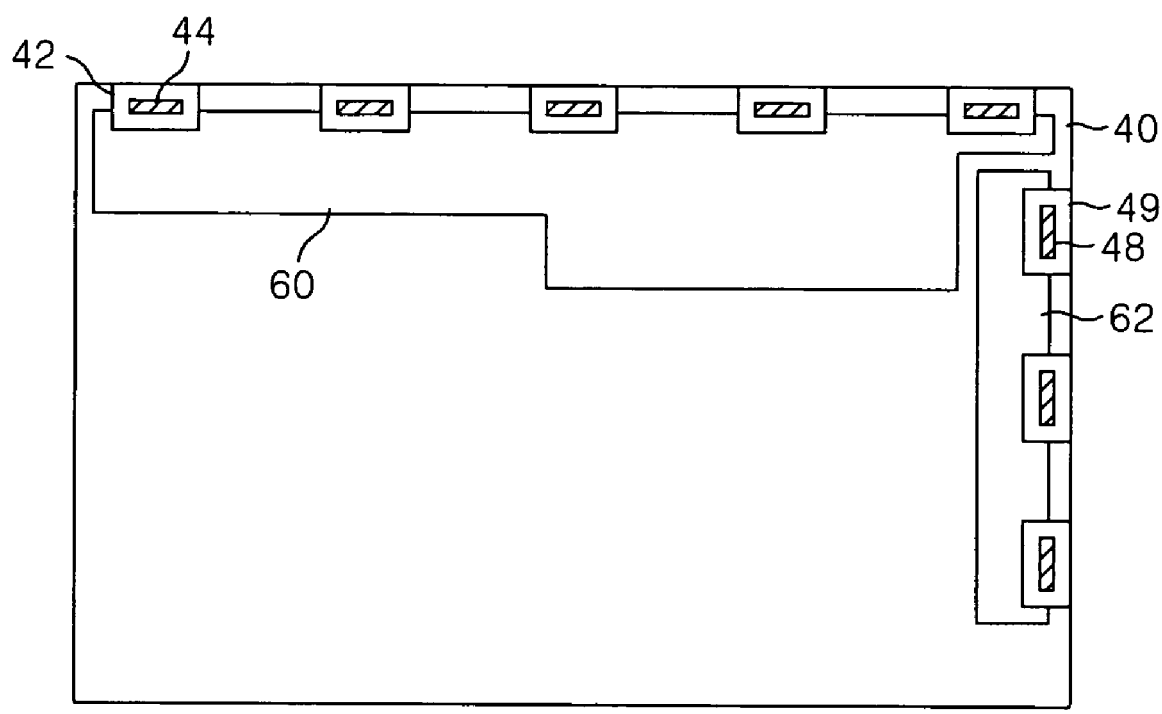
FIG. 6 is a plan view showing a rear structure of an LCD panel adopting the TCP (or COF) according to any one of the three exemplary embodiments of the present invention.

FIG. 6 is a plan view showing a rear structure of the LCD panel 40 adopting the data TCP (or COF) 42. As shown in FIG. 6, when the LCD panel 40 has a XGA class resolution of 1024×768 pixels, it is provided with total 3072 data lines in light of R, G and B sub-pixel included per pixel. If these 3072 data lines are intended to be driven by the data D-IC 44 having 624(642) output channels shown in FIG. 4, then it is sufficient to use 5 data D-ICs 44 and 5 data TCPs (or COFs) 42 for the LCD panel 40. Accordingly, it is possible to reduce the manufacturing costs of the LCD panel 40 more than the related art where the data D-IC 44 and the data TCP (or COF) 42 having 8×384 channels are used. Particularly, the data TCP (or COF) 42 having 624(642) output channels is molded from the 35 mm base TCPs 50/70/80 as described above, thereby further reducing the manufacturing costs.

As shown in FIG. 6, the data D-IC 44 is connected to the data line of the LCD panel 40 via the data TCP (or COF) 42, and is connected to a timing controller (not shown) via the data TCP (or COF) 42 and the data PCB 60. The data D-IC 44 converts a digital pixel data signal from the timing controller into an analog pixel signal and applies the analog pixel signal to the data line. On the other hand, the gate D-IC 48 is connected to the gate line of the LCD panel 40 via the gate TCP (or COF) 49, and is connected to the timing controller via the gate TCP (or COF) 49 and a gate PCB 62. The gate D-IC 48 supplies a turn-on voltage of the thin film transistor to the gate line during a corresponding scan period while supplying a turn-off voltage of the thin film transistor thereto during the remaining period under control of the timing controller.

As describe above, the chip-mounted film package, namely, the TCP (or COF) according to the exemplary embodiments of the present invention has an extended area for forming the output pads or has a position of the sprocket holes changed. In such an arrangement, an effective area can be enlarged without enlarging the horizontal width of the base TCP (or COF) to increase the number of the output channels of the TCP (or COF) and thereby reduce the number of the TCPs (or COFs) used in an LCD module. As a result, it is possible to reduce the manufacturing costs, and improve productivity as well as quality per unit process.

It will be apparent to those skilled in the art that various modifications and variations can be made in the chip-mounted film package of the present invention without departing from the spirit or scope of the invention. Thus, it is intended that the present invention cover the modifications and variations of this invention provided they come within the scope of the appended claims and their equivalents.

What is claimed is:

1. A chip-mounted film package, comprising:
a base film including a cutting line;
an effective film package defined on the base film by the cutting line and including input area and output area;
a driving chip mounted on the effective film package;
a plurality of sprocket holes formed on the base film;
a plurality of input pads arranged on the input area of the effective film package and connected to the driving chip; and
a plurality of output pads arranged on the output area of the effective film package and connected to the driving chip,
wherein the output area includes at least one extended portion that protrudes from a side of the effective film package in a horizontal direction of the base film, and at least one of the sprocket holes is removed so as to leave a space for forming the extended portion.

2. The package according to claim 1, wherein the base film includes a dummy area outside the cutting line, and the dummy area includes the plurality of sprocket holes to deliver the base film.

3. The package according to claim 2, wherein the sprocket holes are arranged along a vertical direction of the base film.

4. The package according to claim 3, wherein the at least one extended portion is positioned between the sprocket holes.

5. The package according to claim 1, wherein the output area including the extended portion has a same width as that of the base film in the horizontal direction.

* * * * *